(12) United States Patent
Robinson et al.

(10) Patent No.: US 12,422,376 B2
(45) Date of Patent: Sep. 23, 2025

(54) IMAGING REFLECTOMETRY FOR INLINE SCREENING

(71) Applicant: KLA Corporation, Milpitas, CA (US)

(72) Inventors: John Charles Robinson, Austin, TX (US); Stilian Pandev, Santa Clara, CA (US); Shifang Li, Pleasanton, CA (US); Mike Von Den Hoff, Munich (DE); Justin Lach, Portage, MI (US); Barry Saville, Gansevoort (GB); David W. Price, Austin, TX (US); Robert J. Rathert, Mechanicsville, VA (US); Chet V. Lenox, Lexington, TX (US); Thomas Groos, Mengerskirchen (DE); Oreste Donzella, San Ramon, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/339,531

(22) Filed: Jun. 4, 2021

(65) Prior Publication Data

US 2022/0307990 A1   Sep. 29, 2022

Related U.S. Application Data

(60) Provisional application No. 63/165,155, filed on Mar. 24, 2021.

(51) Int. Cl.
*G01N 21/95* (2006.01)
*G01B 11/27* (2006.01)
(Continued)

(52) U.S. Cl.
CPC ......... *G01N 21/9501* (2013.01); *G01B 11/27* (2013.01); *G01N 21/55* (2013.01); *G06N 20/00* (2019.01)

(58) Field of Classification Search
CPC .............. G01N 21/9501; G01N 21/55; G01N 21/95607; G01B 11/27; G06N 20/00; G03F 7/70508; G03F 7/7065; G03F 7/70616
See application file for complete search history.

(56) References Cited

U.S. PATENT DOCUMENTS

| 9,098,893 B2 | 8/2015 | Dalla-Torre et al. |
| 9,710,728 B2 | 7/2017 | Pandev et al. |

(Continued)

FOREIGN PATENT DOCUMENTS

| TW | 202004934 A | 1/2020 |
| TW | 202041852 A | 11/2020 |
| WO | 2018212787 A1 | 11/2018 |

OTHER PUBLICATIONS

International Search Report and Written Opinion in PCT/US2022/019057 dated Jun. 15, 2022, 12 pages.
(Continued)

*Primary Examiner* — Tarifur R Chowdhury
*Assistant Examiner* — Carlos Perez-Guzman
(74) *Attorney, Agent, or Firm* — Suiter Swantz IP

(57) ABSTRACT

A die screening system may receive die-resolved metrology data for a population of dies on one or more samples from the one or more in-line metrology tools after one or more fabrication steps, where the die-resolved metrology data includes images generated using one or more measurement configurations of the one or more in-line metrology tools. In this way, the die-resolved metrology data provides many measurement channels per die, where a particular measurement channel includes data from a particular pixel of a particular image. The controller may then generate screening data for the population of dies from the die-resolved metrology data, where the screening data includes a subset of the plurality of measurement channels of the die-resolved
(Continued)

metrology data, and screen the plurality of dies into two or more disposition classes including at least outlier dies based on variability in the screening data.

44 Claims, 8 Drawing Sheets

(51) Int. Cl.
*G01N 21/55* (2014.01)
*G06N 20/00* (2019.01)

(56) References Cited

U.S. PATENT DOCUMENTS

| | | | |
|---|---|---|---|
| 10,352,876 | B2 | 7/2019 | Shchegrov et al. |
| 10,761,128 | B2 | 9/2020 | Price et al. |
| 2005/0179910 | A1 | 8/2005 | Bartov |
| 2009/0037134 | A1 | 2/2009 | Kulkarni et al. |
| 2010/0166290 | A1 | 7/2010 | Wang et al. |
| 2014/0219544 | A1* | 8/2014 | Wu .................. H01L 22/34 382/149 |
| 2015/0012900 | A1 | 1/2015 | Shifrin et al. |
| 2016/0027165 | A1 | 1/2016 | Wu et al. |
| 2016/0282105 | A1 | 9/2016 | Pandev |
| 2017/0193680 | A1* | 7/2017 | Zhang .................. G06V 10/82 |
| 2018/0275189 | A1* | 9/2018 | Price .................. G06F 17/18 |
| 2019/0041329 | A1* | 2/2019 | Hill .................. G02B 27/286 |
| 2019/0067060 | A1* | 2/2019 | Plihal .................. G06T 7/001 |
| 2019/0295874 | A1* | 9/2019 | Bieli .................. G01N 21/211 |
| 2019/0304851 | A1 | 10/2019 | Smith et al. |
| 2019/0384236 | A1 | 12/2019 | Lin et al. |
| 2020/0234418 | A1 | 7/2020 | Feldman et al. |

OTHER PUBLICATIONS

U.S. Appl. No. 17/101,856, filed Nov. 23, 2020, Price et al.
Chang et al., "Application of Two Hopfield Neural Networks for Automatic Four-Element LED Inspection," IEEE Transactions on Systems, Man, and Cybernetics: Part C:Applications and Reviews, IEEE Service Center, vol. 39, No. 3, May 1, 2009, 14 pages.
European Patent Office, Extended European Search Report received in EP Application No. 22776304.2, May 30, 2025, 12 pages.
Taiwan Patent Office, Office Action received in TW Application No. 111107449, Feb. 7, 2025, 26 pages (including translation).

* cited by examiner

IMAGING REFLECTOMETRY FOR INLINE SCREENING

CROSS-REFERENCE TO RELATED APPLICATION

The present application claims the benefit under 35 U.S.C. § 119(e) of U.S. Provisional Application Ser. No. 63/165,155, filed Mar. 24, 2021, entitled IMAGING REFLECTOMETRY FOR INLINE SCREENING (IRIS), which is incorporated herein by reference in the entirety.

TECHNICAL FIELD

The present disclosure relates generally to inline outlier screening of semiconductor devices and, more particularly, to inline screening using imaging reflectometry.

BACKGROUND

Fabrication of semiconductor devices may typically require hundreds of processing steps to form a functioning device. Risk averse users of semiconductor devices, such as automotive, military, aeronautical and medical applications, are increasingly requiring stricter reliability goals. For example, anticipated target failure rates in the range of parts per billion (PPB) are desirable, but are well below current levels. Advanced screening techniques for identifying faulty dies within a sample are required to meet these strict reliability requirements. However, typical screening techniques for identifying die to be removed from the supply chain such as electrical testing all or part of a die may have insufficient throughput. It is therefore desirable to provide systems and methods for efficient screening.

SUMMARY

A die screening system is disclosed in accordance with one or more illustrative embodiments of the present disclosure. In one illustrative embodiment, the system includes a controller communicatively coupled to one or more in-line metrology tools. In another illustrative embodiment, the controller receives die-resolved metrology data for a population of dies on one or more samples from the one or more in-line metrology tools after one or more fabrication steps. The die-resolved metrology data may include one or more images generated using one or more measurement configurations of the one or more in-line metrology tools, where the die-resolved metrology data provides many measurement channels per die, and where a particular measurement channel includes data from a particular pixel of a particular image. In accordance with one or more illustrative embodiments of the present disclosure, the controller generates screening data for the plurality of dies from the die-resolved metrology data, where the screening data includes a subset of the measurement channels of the die-resolved metrology data, and where the measurement channels in the screening data are sensitive to process variations associated with fabrication of the one or more samples. In another illustrative embodiment, the controller screens the plurality of dies into two or more disposition classes based on variability in the screening data, wherein the two or more disposition classes include at least a set of pass dies and a set of outlier dies.

A die screening system is disclosed in accordance with one or more illustrative embodiments of the present disclosure. In one illustrative embodiment, the system includes one or more in-line metrology tools and a controller. In another illustrative embodiment, the controller receives die-resolved metrology data for a population of dies on one or more samples from the one or more in-line metrology tools after one or more fabrication steps. The die-resolved metrology data may include one or more images generated using one or more measurement configurations of the one or more in-line metrology tools, where the die-resolved metrology data provides many measurement channels per die, and where a particular measurement channel includes data from a particular pixel of a particular image. In accordance with one or more illustrative embodiments of the present disclosure, the controller generates screening data for the plurality of dies from the die-resolved metrology data, where the screening data includes a subset of the measurement channels of the die-resolved metrology data, and where the measurement channels in the screening data are sensitive to process variations associated with fabrication of the one or more samples. In another illustrative embodiment, the controller screens the plurality of dies into two or more disposition classes based on variability in the screening data, wherein the two or more disposition classes include at least a set of pass dies and a set of outlier dies.

A die screening method is disclosed in accordance with one or more illustrative embodiments of the present disclosure. In one illustrative embodiment, the method includes generating die-resolved metrology data for a population of dies on one or more samples from one or more in-line metrology tools after one or more fabrication steps. The die-resolved metrology data may include one or more images generated using one or more measurement configurations of the one or more in-line metrology tools, where the die-resolved metrology data provides many measurement channels per die, and where a particular measurement channel includes data from a particular pixel of a particular image. In another illustrative embodiment, the method includes generating screening data for the plurality of dies from the die-resolved metrology data, where the screening data includes a subset of the plurality of measurement channels of the die-resolved metrology data, wherein the measurement channels in the screening data are sensitive to process variations associated with fabrication of the one or more samples. In another illustrative embodiment, the method includes screening the plurality of dies into two or more disposition classes based on variability in the screening data, where the two or more disposition classes include at least a set of pass dies and a set of outlier dies.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
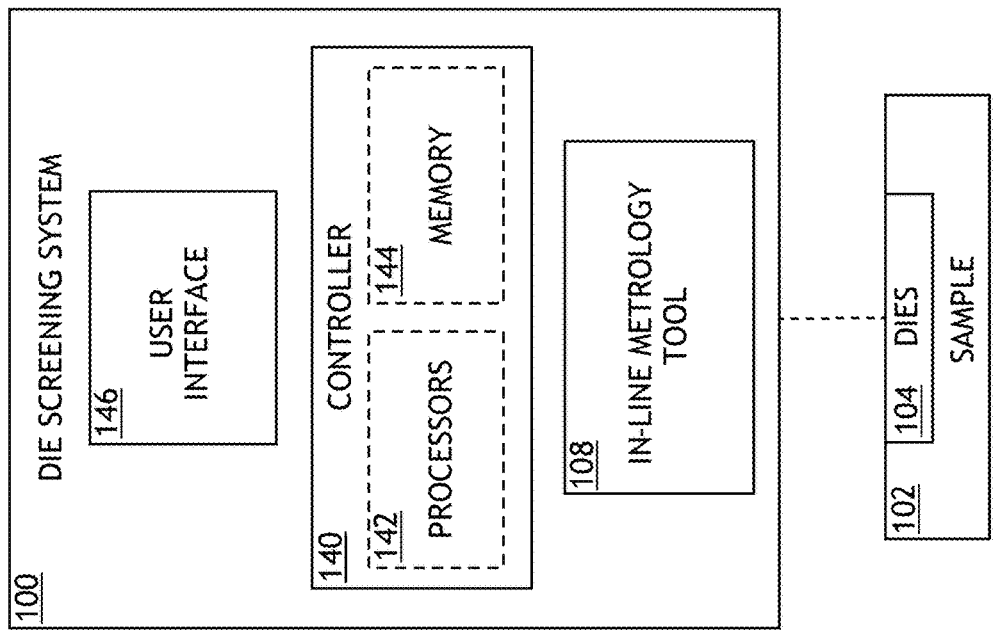
FIG. 1A is a conceptual view of a die-screening system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for die dispositioning (e.g., screening) based on parametric variability using multi-channel die-resolved metrology data from one or more in-line metrology measurements providing full sampling of the dies (e.g., multiple to many measurements per die). Die dispositioning may include classifying fabricated dies on one or more samples as passing dies suitable for integration into a supply chain, failed dies unsuitable for integration into the supply chain, borderline die requiring further testing, or the like. For the purposes of the present disclosure, the term "die-resolved" is used to refer to metrology measurements of a die in which the die and various features thereon are resolved. In this way, multiple measurements are generated for each die. For example, die-resolved metrology data may include images of dies in a population generated by one or more in-line metrology tools after one or more processing steps during fabrication of the dies. In this way, each pixel of an image of a die may correspond to a measurement of a different location on the die and may thus correspond to an imaging channel. Further, various images may be generated using any number of in-line metrology tools using any number of different measurement configurations after any number of process steps. As a result, the die-resolved metrology data may include many (e.g., up to the order of millions or more) measurement channels, where each measurement channel corresponds to a particular pixel of a particular image generated by a particular in-line metrology tool after a particular processing step.

It is recognized herein that although various strategies have been developed to monitor or control the reliability of devices (e.g., fabricated dies) entering a supply or distribution chain, existing strategies are insufficient to meet the strict reliability requirements (e.g., parts per billion failure rates) while maintaining acceptable throughput.

For example, electrical testing of dies is commonly performed to evaluate the functioning of one or more aspects of the die as data for reliability analysis. This electrical testing may be performed at any point in the manufacturing process and may include, but is not limited to, a pre-burn-in electrical wafer sort and final test (e.g., an e-test) or a post burn-in electrical test. Devices that fail an electrical testing step may be "inked off" and isolated from the remaining devices in the population. However, electrical testing alone may not provide sufficient information to meet stringent reliability standards while maintaining cost and throughput targets. For instance, a post burn-in electrical test may provide an accurate analysis of the functioning of a die since the die is in a near-final state, but may not be practical in high volumes due to cost, time requirements, or the potential for introducing long-term reliability problems. Further, electrical testing during any step of production generally only provides pass/fail information suitable for identifying devices already exhibiting full or partial failures, but may not be suitable identifying devices that may fail at a later time (e.g., devices having latent defects). Additionally, it is often impractical or sometimes impossible to fully characterize each die using electrical testing, resulting in gaps in the electrical testing. For instance, there may exist theoretically-possible defects in a particular circuit layout that may not be detectable using electrical testing even with a "perfect" testing strategy.

By way of another example, part average testing (PAT) techniques such as, but not limited to, traditional PAT, parametric PAT (P-PAT), geographical PAT (G-PAT) or composite PAT (C-PAT) may utilize statistical methods to identify dies having abnormal characteristics (e.g., outlier die) based on the identification of defects within the dies. For instance, PAT methodologies may statistically analyze defects or defectivities of dies within a common sample or within a sample lot to identify the outlier dies. However, PAT methodologies may be susceptible to "overkill" in which otherwise good dies with a low chance of early life failure are improperly inked off, resulting in decreased throughput of the production line and increased cost per device.

By way of another example, existing in-line screening techniques utilize various in-line defect inspection or metrology measurements after one or more fabrication steps for die screening. For instance, in-line PAT (I-PAT) may extend PAT techniques to consider defects identified through in-line sample analysis measurements. I-PAT techniques are generally described in U.S. Pat. No. 10,761,128 issued on Sep. 1, 2020 and U.S. patent application Ser. No. 17/101,856 filed on Nov. 23, 2020, both of which are incorporated herein by reference in their entirety. However, the in-line measurements utilized by I-PAT techniques are typically provided by measurements made for process control purposes and may fail to provide adequate data for robust die screening. In particular, I-PAT techniques typically utilize the results of dedicated in-line measurements of particular aspects of a die or a sample to identify defects for screening purposes. These defects may broadly be of two types: first, in the form of objects or patterns that should not be present (e.g., such as embedded particles, bridges, gaps, or the like), or second, in the form of parametric deviations of otherwise properly fabricated sample layers or features thereon (e.g., variations in measured values of overlay, critical dimensions (CDs), film composition, film thickness, or the like).

It is contemplated herein that reliance on dedicated measurements of particular parameters for in-die screening may be insufficient to provide robust and highly-sensitive screening at tolerable throughputs. In particular, defects of the first type may be readily amenable to high-throughput optical inspection. For example, optical inspection data of a test die may be compared to reference data to identify such defects. However, defects of the second type are typically measured at dedicated locations on a sample (e.g., dedicated targets or selected sampling locations). In the case that higher sampling density data is desired, the measurements generated at the sampling locations are typically interpolated.

It is further contemplated herein that in-line die-resolved metrology measurements generated after one or more process steps may provide a rich dataset for die screening based on parametric variability. Die-resolved metrology measurements may be generated using a variety of metrology tools including, but not limited to, optical metrology tools, X-ray metrology tools, or particle-based metrology tools (e.g., electron-beam (e-beam) metrology tools, ion beam metrology tools, or the like). In some embodiments, parametric variability screening is performed using imaging reflectometry data. For instance, an imaging reflectometer may have, but is not required to have, multiple imaging channels to provide multi-channel images (e.g., a bright-field image at one or more wavelengths, a dark-field image at one or more wavelengths, or the like). It is to be understood, however, that the systems and methods disclosed herein may extend to any type of die-resolved metrology technique.

Further, the die-resolved metrology measurements used herein for die-screening may differ from those used for alternative in-line screening techniques such as I-PAT in that the die-resolved metrology measurements may not necessarily provide as much data as traditional dedicated in-line metrology measurements. For example, a SpectraShape measurement provided by KLA Corp. may provide a multitude of wavelengths, polarizations, or the like to provide highly-sensitive measurements of a wide range of sample geometries through robust models that may handle considerable variability and float many parameters (e.g., 16 or greater parameters) in a measurement. In contrast, die-resolved metrology measurements used herein for die-screening may provide relatively fewer configurations or measurement channels. However, it is contemplated herein that die screening based on parametric variability may rely on relative variations between dies rather than specific values of any metrology measurement. In this way, the amount of data generated by a die-resolved optical metrology dataset may be balanced with measurement throughput to provide both sensitive die screening and achieve high throughputs. Further, die screening based on parametric variability through die-resolved metrology measurements as disclosed herein may be combined with complementary die-screening techniques such as, but not limited to, I-PAT to provide robust die screening.

In some embodiments, only a subset of the die-resolved metrology data of a population of dies is used for die screening. For example, it may be the case that meaningful parametric variations between various die may be determined using a subset of available measurement channels. Accordingly, various techniques may be utilized to generate screening data including a sub-set of the die-resolved metrology data (e.g., a subset of the available measurement channels) for die screening. For example, the screening data may be generated based on the inclusion of measurement channels having known or expected variability to process variations, selecting regions of interest, a dimensionality reduction technique, or the like.

In some embodiments, a single measurement per die is sufficiently representative of the die that die-screening may be carried out through empirical analysis of this measurement for the dies of interest. In some embodiments, die screening is performed by generating one or more metrology measurements of processing parameters and screening based on the processing parameter measurements. Processing parameter measurements may include, but are not limited to, measurements of overlay, CD, film thickness, film composition, film refractive index, film uniformity, feature height, sidewall angle, lithographic exposure parameters (e.g., focal position, dose, energy density, or the like), or chemical-mechanical-planarization (CMP) polish time. For example, metrology measurements of processing parameters may be generated using any of the various model-based or model-less (e.g., machine-learning-based) approaches. In some embodiments, die-screening is performed by a machine-learning-based outlier analysis in which all of the die-resolved optical metrology data for the dies is analyzed to determine die-level parameter metrics for the dies of interest. For example, a machine-learning outlier analysis may include a dimensionality reduction to determine which of the many measurements provided by an optical metrology tool, or combinations thereof, are indicative of parameter variations between the dies and may further generate the die-level parameter metrics based on this dimensionality reduction.

Further, die screening may be performed solely with screening data associated with a single process step or be based on differential signals associated with different process steps, different in-line metrology tools, and/or simulated data. For example, die screening may be performed based on differential signals between screening data associated with a particular die and one or more additional dies. By way of another example, a die-level parameter metric may be generated based on differential signals between the particular die and simulated data. By way of another example, a die-level parameter metric may be generated based on differential signals associated with the particular die at different process steps. In this way, the systems and methods disclosed herein may track the variability of signals between process steps. By way of another example, a die-level parameter metric may be generated based on differential signals for a particular die from different optical metrology tools.

Additional embodiments of the present disclosure are directed to classifying dies of a population for dispositioning. For example, the dies may be screened into two or more classes including, but not limited to, passed dies, failed dies, or borderline dies requiring additional testing. Further, the die screening may be performed solely on the die-level parametric variability as disclosed herein or generated using the systems and methods disclosed herein or in combination with additional screening techniques. For example, a die aggregator may aggregate the results of parametric variability screening or data associated with any step of the screening process with additional screening data from additional screening techniques to disposition the dies based on aggregated data. By way of another example, the die-level parameter metrics may be used to supplement additional screening techniques such as, but not limited to, I-PAT techniques. For example, defects on dies in the population identified using I-PAT techniques may be weighted at least in part using the results of the parametric variability screening or data associated with any step of the process.

Referring now to FIGS. 1A-3, systems and methods for in-line parametric variability screening are described in greater detail in accordance with one or more embodiments of the present disclosure.

Figure 1B:
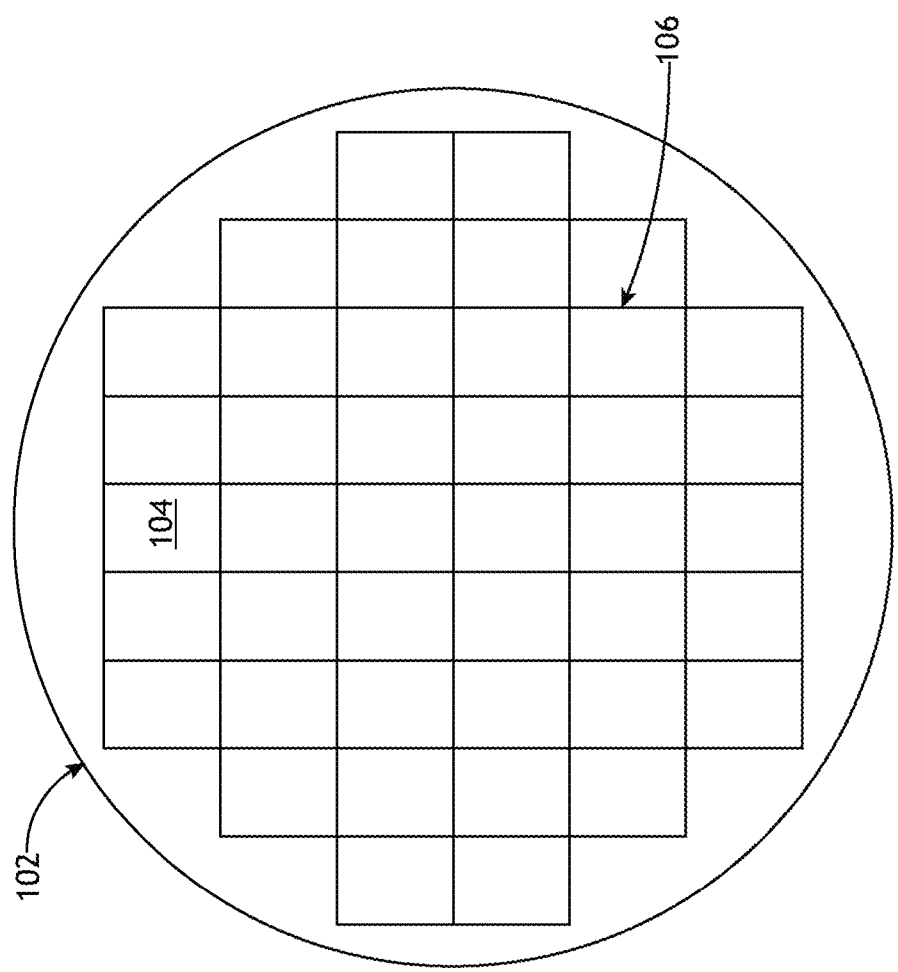
FIG. 1B is a conceptual top view of a sample including multiple dies, in accordance with one or more embodiments of the present disclosure.

FIG. 1A is a conceptual view of a die-screening system 100 in accordance with one or more embodiments of the present disclosure. FIG. 1B is a conceptual top view of a sample 102 including multiple dies 104 in accordance with one or more embodiments of the present disclosure. For example, various dies 104 may be separated by scribe lines 106 such that multiple devices on the various dies 104 may be simultaneously fabricated on the sample 102 and later separated (e.g., in a dicing step) to provide separate devices.

In one embodiment, the die-screening system 100 includes at least one in-line metrology tool 108 (e.g., an in-line sample analysis tool) for generating die-resolved metrology measurements associated with one or more layers of a sample 102 after one or more process steps. The die-screening system 100 may generally include any number or type of in-line metrology tool 108. For example, an in-line metrology tool 108 may include an optical metrology tool configured to perform metrology measurements based on interrogation of the sample 102 with light from any source such as, but not limited to, a laser source, a lamp source, an X-ray source, or a broadband plasma source. By way of another example, an in-line metrology tool 108 may include a particle-beam metrology tool configured to perform metrology measurements based on interrogation of the sample with one or more particle beams such as, but not limited to, an electron beam, an ion beam, or a neutral particle beam.

Further, die-resolvable metrology measurements may include any type of data providing multiple measurements of a die 104 on a sample 102. In one embodiment, the die-resolved metrology data includes imaging data, which may be generated in one or more data capture steps. For example, an in-line metrology tool 108 may include or be configured to provide an image of a die 104 (or a portion thereof) within a field of view in a particular data capture step. Die-resolvable data associated with the dies 104 or the sample 102 as a whole may then be generated by stitching or otherwise combining multiple images. By way of another example, an in-line metrology tool 108 may generate die-resolvable data point-wise (e.g., at periodic intervals or in a selected measurement pattern).

Figure 1C:
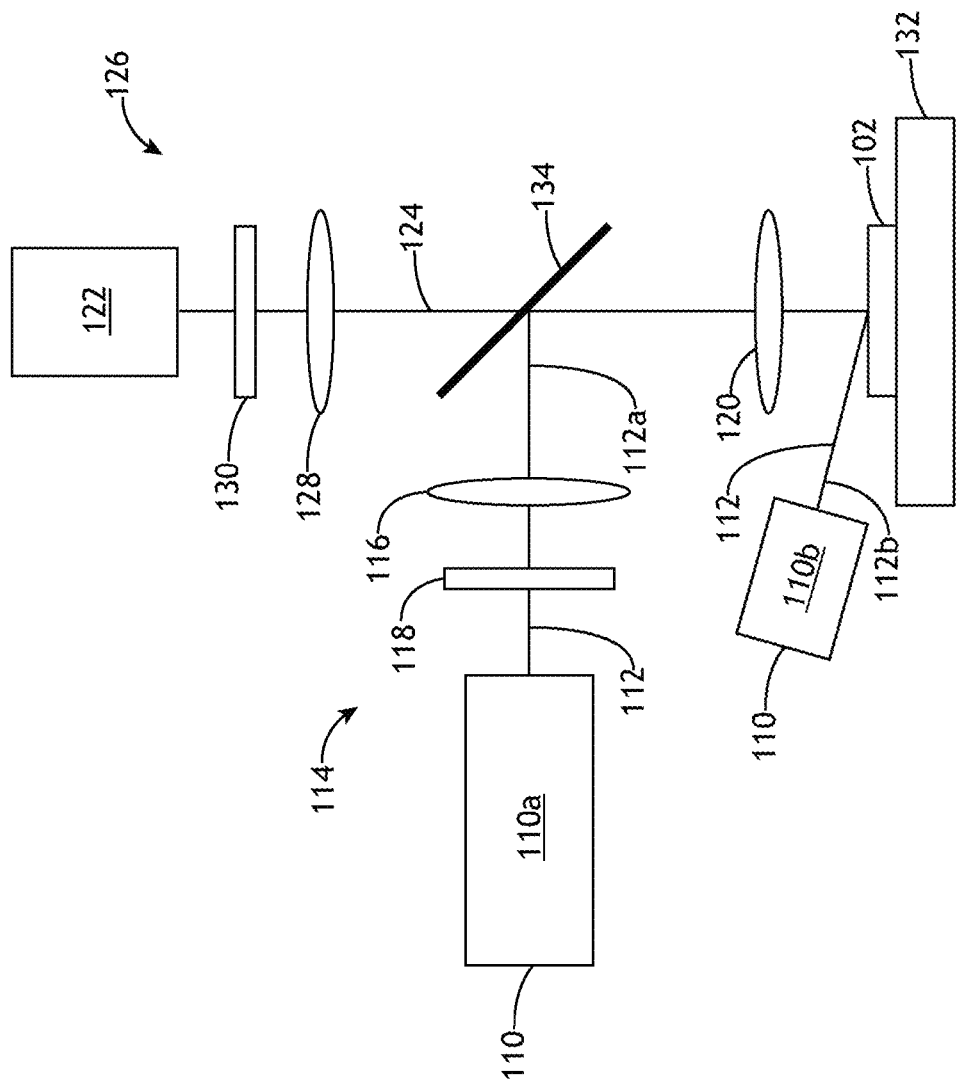
FIG. 1C is a conceptual view of an in-line metrology tool configured as an imaging reflectometer, in accordance with one or more embodiments of the present disclosure.

FIG. 1C is a conceptual view of an in-line metrology tool 108 configured as an imaging reflectometer, in accordance with one or more embodiments of the present disclosure.

In one embodiment, the in-line metrology tool 108 includes an illumination source 110 configured to generate at least one illumination beam 112. The illumination from the illumination source 110 may include one or more selected wavelengths of light including, but not limited to, ultraviolet (UV) radiation, visible radiation, or infrared (IR) radiation.

The illumination source 110 may include any type of illumination source suitable for providing at least one illumination beam 112. In one embodiment, the illumination source 110 is a laser source. For example, the illumination source 110 may include, but is not limited to, one or more narrowband laser sources, a broadband laser source, a supercontinuum laser source, a white light laser source, or the like. In this regard, the illumination source 110 may provide an illumination beam 112 having high coherence (e.g., high spatial coherence and/or temporal coherence). In another embodiment, the illumination source 110 includes a laser-sustained plasma (LSP) source. For example, the illumination source 110 may include, but is not limited to, a LSP lamp, a LSP bulb, or a LSP chamber suitable for containing one or more elements that, when excited by a laser source into a plasma state, may emit broadband illumination. In another embodiment, the illumination source 110 includes a lamp source. For example, the illumination source 110 may include, but is not limited to, an arc lamp, a discharge lamp, an electrode-less lamp, or the like. In this regard, the illumination source 110 may provide an illumination beam 112 having low coherence (e.g., low spatial coherence and/or temporal coherence).

In another embodiment, the in-line metrology tool 108 directs the illumination beam 112 to the sample 102 via an illumination pathway 114. The illumination pathway 114 may include one or more optical components suitable for modifying and/or conditioning the illumination beam 112 as well as directing the illumination beam 112 to the sample 102. In one embodiment, the illumination pathway 114 includes one or more illumination-pathway lenses 116 (e.g., to collimate the illumination beam 112, to relay pupil and/or field planes, or the like). In another embodiment, the illumination pathway 114 includes one or more illumination-pathway optics 118 to shape or otherwise control the illumination beam 112. For example, the illumination-pathway optics 118 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the in-line metrology tool 108 includes an objective lens 120 to focus the illumination beam 112 onto the sample 102.

In another embodiment, the in-line metrology tool 108 includes one or more detectors 122 configured to capture light or other emanating from the sample 102 (e.g., collected light 124) through a collection pathway 126. The collection pathway 126 may include one or more optical elements suitable for modifying and/or conditioning the collected light 124 from the sample 102. In one embodiment, the collection pathway 126 includes one or more collection-pathway lenses 128 (e.g., to collimate the illumination beam 112, to relay pupil and/or field planes, or the like), which may include, but is not required to include, the objective lens 120. In another embodiment, the collection pathway 126 includes one or more collection-pathway optics 130 to shape or otherwise control the collected light 124. For example, the collection-pathway optics 130 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

The in-line metrology tool 108 may generally include any number or type of detectors 122 suitable for capturing light from the sample 102. In one embodiment, a detector 122 includes one or more sensors suitable for characterizing a static sample. In this regard, the in-line metrology tool 108 may operate in a static mode in which the sample 102 is static during a measurement. For example, a detector 122 may include a two-dimensional pixel array such as, but not limited to, a charge-coupled device (CCD) or a complementary metal-oxide semiconductor (CMOS) device. In this regard, the detector 122 may generate a two-dimensional image (e.g., a field-plane image or a pupil-plan image) in a single measurement. In another embodiment, the detector 122 includes one or more sensors suitable for characterizing a moving sample (e.g., a scanned sample). In this regard, the in-line metrology tool 108 may operate in a scanning mode in which the sample 102 is scanned with respect to a measurement field during a measurement. For example, the detector 122 may include a 2D pixel array with a capture time and/or a refresh rate sufficient to capture one or more images during a scan within selected image tolerances (e.g., image blur, contrast, sharpness, or the like). By way of another example, the detector 122 may include a line-scan detector to continuously generate an image one line of pixels at a time. By way of another example, the detector 122 may include a time-delay integration (TDI) detector where the motion of the sample 102 is synchronized to charge-transfer clock signals in the TDI detector. In another embodiment, a detector 122 includes a spectrometer or spectroscopic sensor suitable for providing wavelength-resolved data.

In another embodiment, the in-line metrology tool 108 includes a sample stage 132 suitable for securing the sample 102 and further configured to position the sample 102 with respect to the illumination beam 112. For example, the sample stage 132 may include any combination of linear actuators, rotational actuators, or angular actuators (e.g., to control the tip and/or tilt of the sample 102). In another embodiment, though not shown, the die-screening system 100 includes one or more beam-scanning optics (e.g., rotatable mirrors, galvanometers, or the like) to scan the illumination beam 112 with respect to the sample 102).

The illumination pathway 114 and the collection pathway 126 of the in-line metrology tool 108 may be oriented in a wide range of configurations suitable for illuminating the sample 102 with the illumination beam 112 and collecting light emanating from the sample 102 in response to the incident illumination beam 112. For example, as illustrated in FIG. 1C, the in-line metrology tool 108 may include a beamsplitter 134 oriented such that a common objective lens 120 may simultaneously direct the illumination beam 112 to the sample 102 and collect light from the sample 102. In this regard, the in-line metrology tool 108 may provide, but is not limited to, bright-field imaging of the sample 102. For instance, FIG. 1C illustrates a first illumination source 110a providing on-axis illumination of the sample 102 (e.g., via the beamsplitter 134) and on-axis collection of light from the sample 102 to provide bright-field imaging and a second illumination source 110b providing illumination of the sample 102 outside of a collection numerical aperture (NA) of the objective lens 120 to provide dark-field imaging. However, it is to be understood that FIG. 1C is provided solely for illustrative purposes and should not be interpreted as limiting. For example, dark-field imaging may be implemented in a wide variety of configurations such as, but not limited to, using one or more apertures in illumination and/or collection pupil planes.

Figure 1D:
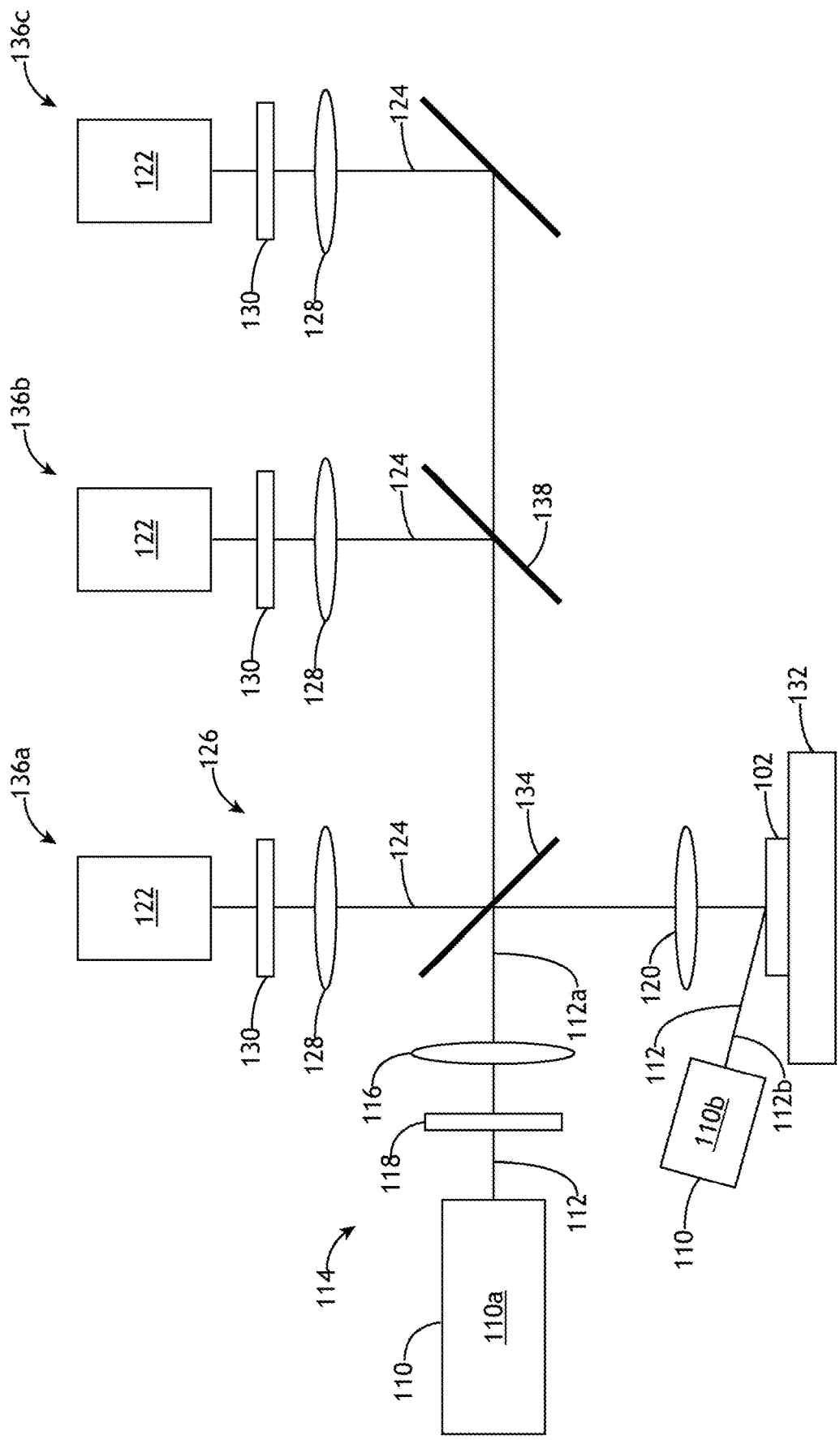
FIG. 1D is a conceptual view of an in-line metrology tool configured as an imaging reflectometer providing six measurement channels, in accordance with one or more embodiments of the present disclosure.

Referring now generally to FIGS. 1C and 1D, the in-line metrology tool 108 may be configured as a multi-channel tool. In this way, the die-resolved metrology data includes multi-channel data associated with each location on a die 104. Further, each channel may be associated with a different set of illumination conditions, collection conditions, wavelengths, or the like.

FIG. 1D is a conceptual view of an in-line metrology tool 108 configured as an imaging reflectometer providing six measurement channels in accordance with one or more embodiments of the present disclosure. In particular, FIG. 1D illustrates a configuration including bright-field and dark-field measurements with three wavelengths. For example, the in-line metrology tool 108 may include three detection channels 136a-c coupled with a first illumination beam 112a configured to illuminate the sample 102 within a collection NA of the objective lens 120 to provide bright-field imaging and a second illumination beam 112b configured to illuminate the sample 102 outside the collection NA of the objective lens 120 to provide dark-field imaging. The detection channels 136a-c may be formed using any technique known in the art including, but not limited to, a series of dichroic beamsplitters 138 as shown in FIG. 1D or wavelength-insensitive beamsplitters coupled with spectral filters.

As described previously herein, the in-line metrology tool 108 may include any type of metrology tool suitable for generating die-resolved metrology data including, but not limited to, an X-ray metrology tool or a particle-based metrology tool. Accordingly, FIGS. 1C and 1D are provided solely for illustrative purposes and should not be interpreted as limiting. For example, the in-line metrology tool 108 may include, but is not limited to, a hyperspectral imaging tool, or an X-ray ptychography tool.

Referring again to FIG. 1A, in one embodiment, the die-screening system 100 includes a controller 140. The controller 140 may include one or more processors 142 configured to execute program instructions maintained on memory 144 (e.g., a memory medium, memory device, or the like). Further, the controller 140 may be communicatively coupled with any of the components of the die-screening system 100 including, but not limited to, the in-line metrology tool 108 or any components therein. In this regard, the one or more processors 142 of controller 140 may execute any of the various process steps described throughout the present disclosure such as, but not limited to, receiving die-resolved metrology data, generating die-level parameter metrics based on the die-resolved metrology data, or dispositioning dies based at least in part on the die-level parameter metrics.

The one or more processors 142 of a controller 140 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 142 may include any device configured to execute algorithms and/or instructions (e.g., program instructions stored in memory). In one embodiment, the one or more processors 142 may be embodied as a desktop computer, mainframe computer system, workstation, image computer, parallel processor, networked computer, or any other computer system configured to execute a program configured to operate or operate in conjunction with the die-screening system 100, as described throughout the present disclosure.

The memory 144 may include any storage medium known in the art suitable for storing program instructions executable by the associated one or more processors 142. For example, the memory 144 may include a non-transitory memory medium. By way of another example, the memory 144 may include, but is not limited to, a read-only memory (ROM), a random-access memory (RAM), a magnetic or optical memory device (e.g., disk), a magnetic tape, a solid-state drive and the like. It is further noted that the memory 144 may be housed in a common controller housing with the one or more processors 142. In one embodiment, the memory 144 may be located remotely with respect to the physical location of the one or more processors 142 and the controller 140. For instance, the one or more processors 142 of the controller 140 may access a remote memory (e.g., server), accessible through a network (e.g., internet, intranet and the like).

In one embodiment, a user interface 146 is communicatively coupled to the controller 140. In one embodiment, the user interface 146 may include, but is not limited to, one or more desktops, laptops, tablets, and the like. In another embodiment, the user interface 146 includes a display used to display data of the die-screening system 100 to a user. The display of the user interface 146 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 146 is suitable for implementation in the present disclosure. In another embodiment, a user may input selections and/or instructions responsive to data displayed to the user via a user input device of the user interface 146.

Figure 2:
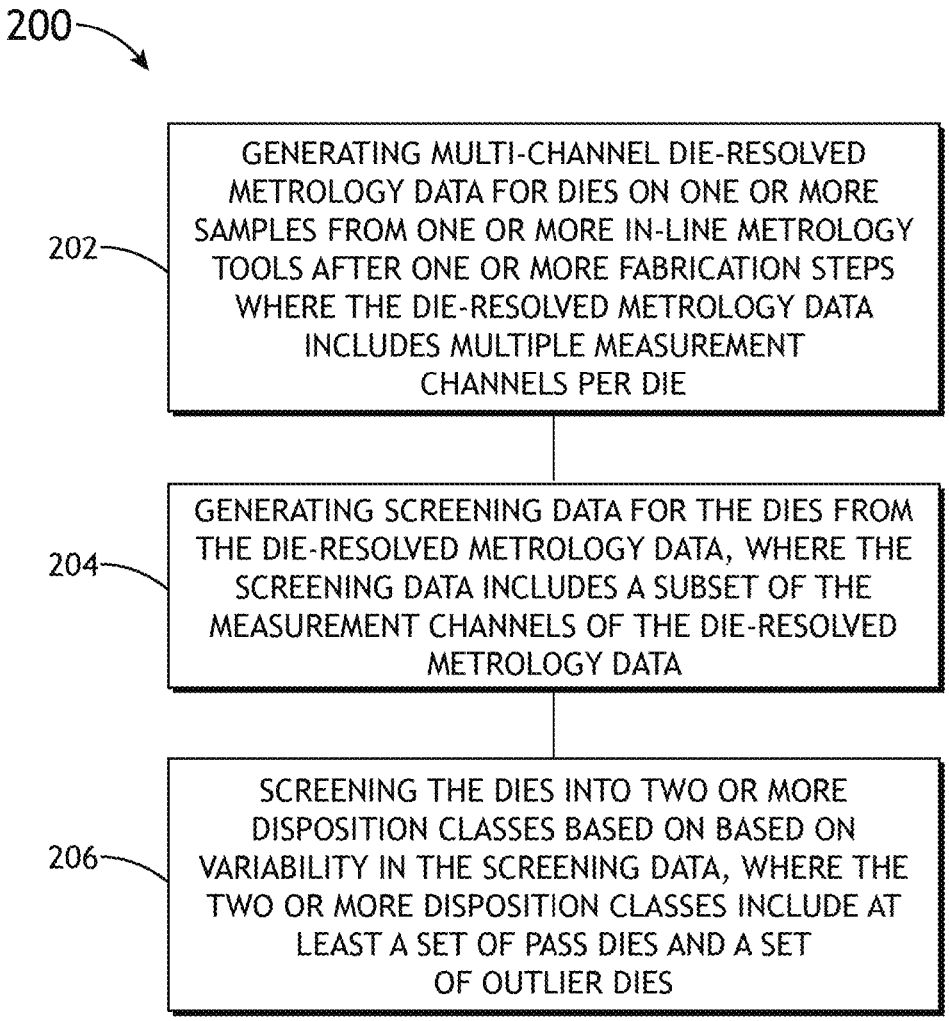
FIG. 2 is a flow diagram illustrating steps performed in a method for die screening based on parametric variability, in accordance with one or more embodiments of the present disclosure.

Referring now to FIG. 2, FIG. 2 is a flow diagram illustrating steps performed in a method 200 for die screening based on parametric variability, in accordance with one or more embodiments of the present disclosure. Applicant notes that the embodiments and enabling technologies described previously herein in the context of the die-screening system 100 should be interpreted to extend to method 200. It is further noted, however, that the method 200 is not limited to the architecture of the die-screening system 100.

In one embodiment, the method 200 includes a step 202 of generating multi-channel die-resolved metrology data for dies on one or more samples from one or more in-line metrology tools after one or more fabrication steps, where the die-resolved metrology data includes multiple measurement channels per die. For example, the die-resolved metrology data may include one or more images of each die generated using one or more measurement configurations of the one or more in-line metrology tools. For instance, a measurement configuration may include, but is not limited to, an illumination incidence angle (e.g., azimuth and/or polar angle), a collection angle (e.g., azimuth and/or polar angle), a illumination polarization, a collection polarization, an illumination wavelength, or collection wavelength. In this way, a particular measurement channel may correspond to data from a particular pixel in a particular image. Put another way, a particular measurement channel may correspond to a particular location on the die (e.g., each pixel is associated with a different location on the die) and a particular measurement configuration of a particular in-line metrology tool.

It is contemplated herein that multi-channel die-resolved metrology data may be distinguished from conventional in-line metrology techniques. For example, typical in-line metrology techniques such as, but not limited to, those used for process control may generate sensitive measurements of a particular process parameter (e.g., overlay, CD, film thickness, film composition, film refractive index, film uniformity, feature height, sidewall angle, lithographic exposure parameters, CMP polish time, or the like) based on measurements of particular features on the sample such as dedicated metrology targets or selected device features. In some instances (e.g., target-based overlay), a dedicated target or series of targets may be constructed to provide a deterministic metrology measurement based on particular measurements of the target. In some instances, a model, library, and/or machine-learning technique is used to relate measurements generated with specific measurement conditions to physical metrology parameters. In either case, the in-line metrology tool may generally have many degrees of freedom, but measurements must be performed with highly-controlled measurement conditions on specific sample locations. Thus, full-die (e.g., die-resolved) measurements are generated by interpolation of measurements done at the fixed locations on the sample.

In contrast, multi-channel die-resolved metrology data used herein may be generated by an in-line metrology tool that provides measurements with a fixed sampling pattern at many locations across each die rather than dedicated sampling locations. For example, an image of the die (which may be generated in a single capture or sequential captures) may be associated with measurements at different locations across the die. Further, multiple die images may be generated with multiple measurement configurations or with multiple in-line metrology tools. In this way, the die-resolved metrology data may include multiple channels, where each channel is associated with a particular pixel of a particular image and thus represents measurement data at a particular location using particular measurement conditions.

Additionally, the die-resolved metrology data may include any type of images generated using any type of collection scheme including, but not limited to, full-sample images, grid-level images, or die-level images. Further, the die-resolved metrology data may include raw images generated by the tool or processed images (e.g., normalized, calibrated, or the like) at either a full-scale resolution provided by an in-line metrology tool or a down-sampled resolution. As an illustrative example in the case of an in-line metrology tool including an imaging reflectometer, the die-resolved metrology data may include raw images, debug images, macro-overview images (MOIs), or the like.

It is further contemplated herein that die screening may be performed based on variability between dies rather than specific values of metrology measurements. For example, die screening may identify dies that are different from the rest of a population, where the specific values of any given metrology measurement are not necessarily considered. In this way, although multi-channel die-resolved metrology data used herein may not be tailored to provide a dedicated, high-accuracy measurement of a specific process parameter (e.g., overlay, CD, film thickness, film composition, film refractive index, film uniformity, feature height, sidewall angle, lithographic exposure parameters, CMP polish time, or the like), this data may nonetheless vary in response to variations of these physical characteristics across the die.

Figure 3:
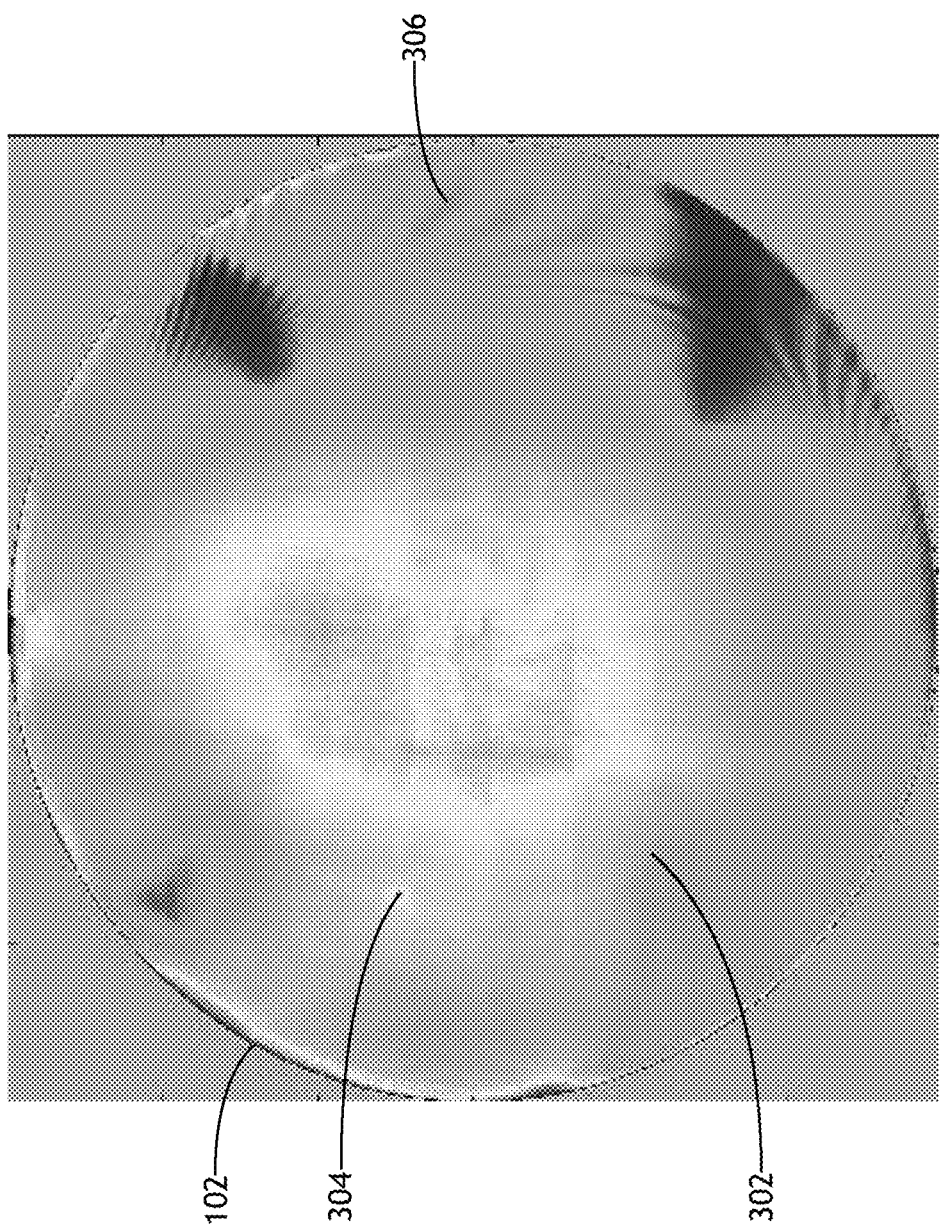
FIG. 3 is an image of a sample with a single film generated using an imaging reflectometer, in accordance with one or more embodiments of the present disclosure.

As a non-limiting illustration, FIG. 3 is an image of a sample 102 with a single film generated using an imaging reflectometer, in accordance with one or more embodiments of the present disclosure. It is noted that the image of the sample 102 in FIG. 3 does not include dies 104 for clarity. In FIG. 3, various process parameters are clearly visible such as the film thickness/uniformity 302 (e.g., visible as gradual signal variations across the sample 102), pinning 304 and chucking/thermal deformations 306.

Such multi-channel die-resolved metrology data may thus be suitable for parametric variability screening to identify dies that deviate from the rest of a given population and may thus have a higher likelihood of failure. The use of such die-resolved metrology data may also beneficially provide many measurements across a die (and thus provide better spatial coverage than the conventional in-die metrology techniques) with a high throughput. For instance, in-die metrology techniques requiring measurements at specific locations have relatively lower throughput due to the time required to align the sample to the specific locations for a measurement and are thus often limited to less than one measurement per die on a sample. Referring again to the non-limiting illustration of FIG. 3, the image includes 69 million pixels and was generated in approximately 90 seconds. In contrast, an equivalent image generated using a conventional metrology tool using a move-acquire-move (MAM) collection scheme to acquire signals at selected locations on the sample would require approximately 2 years to capture.

Such die-resolved metrology data may be generated using various metrology tools including, but not limited to, optical metrology tools, X-ray metrology tools, or particle-beam metrology tools. In one embodiment, the die-resolved metrology data is generated with an imaging reflectometer. For example, as described in the context of the die-screening system 100, an imaging reflectometer may provide various imaging techniques (e.g., bright-field imaging, dark-field imaging, or the like) at multiple wavelengths to provide multi-channel data.

In another embodiment, the die-resolved metrology data is generated with a hyperspectral imaging tool, which may capture data from many (or all) pitches across a die and may further capture multiple diffraction orders (e.g., associated with an edge profile of isolated and edge features). In another embodiment, the die-resolved metrology data is generated with an X-ray ptychography tool, which may similarly capture data associated with a broad spectrum of pitches on a die.

Additionally, die-resolved metrology data may include images generated by multiple in-line metrology tools and/or after different process steps. For example, incorporating measurements from multiple tools may increase the number of measurement channels suitable for monitoring parametric variability using the method 200. By way of another example, incorporating measurements from different process steps may facilitate tracking the variability between process steps.

In another embodiment, the method 200 includes a step 204 of generating screening data for the dies from the die-resolved metrology data, where the screening data includes a subset of the measurement channels of the die-resolved metrology data. For example, the screening data may include selected measurement channels in the screening data that are sensitive to process variations associated with fabrication of the one or more samples. Since the measurement channels are associated with specific measurement conditions at different sample locations, the measurement channels in the screening data may be selected based on location on a die (e.g., locations associated with selected features of interest), measurement conditions, or a combination thereof.

In another embodiment, the method 200 includes a step 206 of screening the dies into two or more disposition classes based on variability in the screening data, wherein the two or more disposition classes include at least a set of pass dies and a set of outlier dies. For example, the set of outlier dies may include dies exhibiting screening data that varies from the rest of the dies (e.g., the rest of the population of dies of interest) beyond a given tolerance and the set of pass dies may exhibit screening data with acceptable variation. It is to be understood, however, that the step 206 may further sort dies into any number of disposition classes. For example, dies may be sorted into a set of pass dies exhibiting acceptable variations in the screening data relative to the population, a set of failed dies exhibiting unacceptable variations in the screening data relative to the population (e.g., dies that are expected to fail immediately or after short-term use), and a set of outlier dies exhibiting variations in the screening beyond an acceptable tolerance for consideration as pass dies and less than a failure tolerance associated with failed dies. In this way, the outlier dies may be associated with dies having a potential risk for latent defects).

It is contemplated herein that robust die screening (e.g., step 206) may be performed based on variability of the die-resolved metrology data generated in step 202. For example, dies having statistically meaningful differences in the die-resolved metrology data (or portions thereof) may have a higher failure risk when used in an intended environment (e.g., a short-term failure or a long-term failure risk higher than the other dies on the sample or sample lot). For this reason, such die may be classified (e.g., in step 206) as outlier dies.

However, not all measurements of the die-resolved metrology data on a particular set of dies (e.g., pixels associated with measurement locations on a die or measurement channels associated with measurement conditions at a particular location) may exhibit variations useful for die screening. Further, some measurements may be redundant. Accordingly, the step 204 of generating the screening data may reduce the volume of data considered to include only relevant measurement channels providing meaningful variability. This step 204 may provide various benefits including, but not limited to, reducing the computational load associated with screening in step 206, improving the speed of the screening in step 206 and thus the total throughput, or improving the accuracy and/or sensitivity of the screening in step 206 by removing potential sources of noise from the dataset used for screening.

It is contemplated herein that the step 204 of generating screening data from the die-resolved metrology data and the step 206 of screening the dies may be carried out in a variety of ways. Further, the screening data may generally include any number of measurement channels from the die-resolved metrology data, ranging from a single measurement channel per die, to tens, hundreds, thousands, millions, or greater measurement channels per die.

In some embodiments, the step 204 of generating screening data for the dies from the die-resolved metrology data includes selecting a subset of the measurement channels having a known or expected variability to process variations during fabrication.

For example, the step 204 may include selecting measurement channels associated with specific locations or sets of locations on a die known or expected to be sensitive to process variations. In one instance, the step 204 may include selecting particular regions of interest (ROIs) on a die. In another instance, the step 204 may include selection based on results from additional inspection or metrology measurements such as, but not limited to, selection based on Flex-Point targeted inspection techniques as developed by KLA Corporation.

By way of another example, the step 204 may include performing a process design of experiments (DOE) to determine the impact of various process variations on each of the measurement channels of the die-resolved metrology data and selecting a subset of measurement channels to be included in the screening data based on the DOE. This DOE may be carried out using any suitable technique including, but not limited to, simulations or fabrication of training samples with programmed process variations and measurements with the in-line metrology tools to generate training die-resolved metrology data.

By way of another example, the step 204 may include downsampling the data based on measurement location and/or measurement conditions to provide a specific resolution or number of measurement channels per die.

Further, the step 204 may be, but is not required to be, tailored to specific sensitivities or variations of interest. For example, the screening data may include measurement channels that are sensitive to variations of specific process variations of interest (e.g., those having a known correlation to reliability) and/or exclude measurement channels that are sensitive to variations of specific process variations that are not of interest (e.g., those having a known low correlation to reliability). By way of another example, the screening data may include selecting measurement channels based on an expected impact on yield.

In the case that the screening data is selected to include measurement channels having a known or expected variability, the step 206 may be implemented in a variety of ways.

In one embodiment, the step 206 may include an empirical analysis (e.g., an empirical trend chart) of the values of one or more measurement channels in the screening data or statistical variations thereof. For example, it may be the case that effective screening may be implemented by comparing the values directly received from particular measurement channels a combination of values from multiple measurement channels (e.g., a weighted combination, an average, or the like) across the dies of interest. By way of another example, the step 206 may be implemented based on tracking one or more statistical metrics of particular measurement channels such as, but not limited to, mean values or standard deviations of data from one or more measurement channels in the screening data for dies across a sample or lots of samples. In this way, the variations of the selected measurement channel or channels may be indicative of variations of relevant process variations, but specific values of process parameters (e.g., overlay, CD, film thickness, film composition, film refractive index, film uniformity, feature height, sidewall angle, lithographic exposure parameters, CMP polish time, or the like) may not necessarily be determined at this step.

In another embodiment, the step 206 may include determining measurements of one or more process parameters based on the data from the measurement channels in the screening data and then screening the dies based on the process parameter measurements. The step 206 may thus be similar to an I-PAT analysis based on in-line metrology data from conventional in-line metrology measurements, but may differ in that the step 206 may beneficially utilize the high-throughput and high spatial coverage provided by the die-resolved metrology data. Further, as described previously herein, robust and sensitive die screening may be achieved based on parametric variability of the die-resolved metrology data even if the sample parameter measurements in step 206 are not as accurate as conventional in-line metrology measurements.

The sample parameter measurements may be generated using a variety of techniques.

In one embodiment, sample parameter measurements are determined by first generating a model relating the data provided by the selected measurement channels in the screening data to one or more sample parameters of interest and then applying the model to the data generated for the dies of interest. For example, the model may include models of the electromagnetic interaction of incident light (e.g., an illumination beam 112) with particular structures associated with the sample die locations in the selected measurement channels, which may be achieved using any technique known in the art including, but not limited to, rigorous coupled wave analysis (RCWA) or finite element method (FEM) techniques. In some instances, the generated model may include one or more floating parameters such that the data from the dies of interest may be fitted to the model.

In another embodiment, sample parameter measurements are determined using one or more machine-learning techniques (e.g., machine-learning models) such as, but not limited to, neural networks, deep learning networks, machine-learning libraries, auto-encoder networks, or the like. For example, a supervised machine-learning model may be trained to provide a sample parameter measurement based on the screening data as an input. Such a machine-learning model may be trained using any suitable training data including, but not limited to, experimental or simulated data. In one instance, training data includes simulated and/or experimental data associated with a design of experiments (DOE) including experimental and/or simulated screening data associated with samples having a range of programmed sample parameter variations.

In some embodiments, sample parameter measurements may be generated using signal response metrology (SRM) techniques. SRM techniques are generally described in U.S. Pat. No. 9,710,728 issued on Jul. 18, 2017 and U.S. Pat. No. 10,352,876 issued on Jul. 16, 2019, both of which are incorporated by reference herein in their entirety.

Referring again generally to the step 204 of generating screening data and the step 206 of screening the dies based on variability of the screening data, in some embodiments, the step 204 includes performing a dimensionality reduction to select the measurement channels providing variability in response to process variations. Any dimensionality reduction technique may be used including, but not limited to, linear techniques (e.g., principal component analysis (PCA) techniques, or the like), non-linear techniques (e.g., multi-dimensional scaling, or the like), unsupervised machine-learning techniques, or supervised machine-learning techniques. For example, die-resolved metrology data may include many measurement channels per die (e.g., on the order of millions or greater). However, it may be the case that the number of channels exhibiting non-redundant meaningful variability may be substantially smaller (e.g., on the order of tens or hundreds). Accordingly, dimensionality reduction may identify a subset of suitable measurement channels suitable for screening in step 206. Further, dimensionality reduction techniques may be applied without prior knowledge or expectations of which measurement parameters may be most sensitive to process variations.

In another embodiment, die screening to identify outlier dies in step 206 may be performed using machine learning techniques. For example, a machine learning technique (e.g., unsupervised or supervised) may be used to identify a set of outlier die based on variations of the screening data. In this way, variability of particular measurement channels and/or variability in patterns or combinations of the measurement channels may be used to identify outlier dies from a population of sampled dies. Further, such a machine-learning based technique may be applied to screening data generated using any technique including, but not limited to, dimensionality reduction, selected ROIs, downsampling, DOEs, or a combination thereof.

Referring now generally to FIG. 2, various steps in the method 200 may be carried out multiple times and/or using multiple techniques. It is contemplated herein that different techniques for implementing the various steps in the method 200 may provide different tradeoffs between sensitivity, robustness, or ease of interpretation. For example, techniques for screening dies (e.g., step 206) based on generating measurements of sample parameters (e.g., using model-based or model-less approaches) may provide insights into the root causes of variability that may lead certain dies to be classified as outlier dies based on the measurements of the sample parameters. In this way, such techniques may facilitate feedback or feed-forward corrections to associated process tools in order to improve or control the fabrication process. However, such techniques may be reliant on the generated model or training data that forms the basis of the approach and may thus not be robust to process variations not accounted for when generating the model or the training data. Further, such techniques may utilize relatively few measurement channels associated with the particular models or training sets and may thus neglect to incorporate the vast amount of information provided in the die-resolved metrology data. By way of another example, techniques for screening dies based on dimensionality reduction to identify relevant measurement channels and machine learning variability analysis of the associated measurement channels may generally utilize all relevant information provided by the die-resolved metrology data and may thus be relatively robust to many types of process variability. However, such techniques may not provide as much insight into root causes of the variations since the analysis is not necessarily linked to any physical sample parameters.

In some embodiments, a set of outlier dies identified using a machine learning technique may be further analyzed using one or more complementary techniques. For example, the set of outlier dies may undergo screening (e.g., step 206) using a complementary technique such as a model or model-less technique for providing measurements of sample parameters, a conventional metrology measurement (e.g., based on measurements of one or more dedicated targets), or the like.

Referring now again generally to FIGS. 1A-2, various actions may be performed on dies in the various disposition classes. In one embodiment, the outlier dies are removed from the supply chain with the goal of reducing the failure rate of the dies in the supply chain. In another embodiment, the outlier dies are subjected to further testing such as, but not limited to, electrical testing, metrology measurements, or inspection measurements to further evaluate the reliability of the die such that decisions on whether to remove these outlier dies from the supply chain may be based on the results of the additional testing.

In another embodiment, the variability screening disclosed herein is one of multiple screening steps on the dies (e.g., a population of dies of interest), where the multiple screening steps may include applications of the method 200 using different techniques, alternative or complementary screening techniques, or a combination thereof. In this way, each screening step may generate a set of outlier dies and final determinations of whether to remove dies from a supply chain may be based on the results of the multiple screening steps. In one instance, dies may be removed from the supply chain if they are identified as outlier dies in a selected number of screening steps. In another instance, dies may be removed from the supply chain based on a weighted analysis of the results of the multiple screening steps.

In another embodiment, parametric variability screening (e.g., as described herein with respect to the die-screening system 100 and/or the method 200) may be provided as a part of an additional die screening technique such as, but not limited to, I-PAT. For example, a defect identified on a particular die by I-PAT screening (e.g., through conventional in-line metrology) may be weighted or scored based at least in part on the parametric variability of the particular die as determined through the method 200). For instance, the defect may be weighted or scored based in part on the disposition class provided by the method 200 and/or any raw data associated with any step of the method 200.

Figure 4:
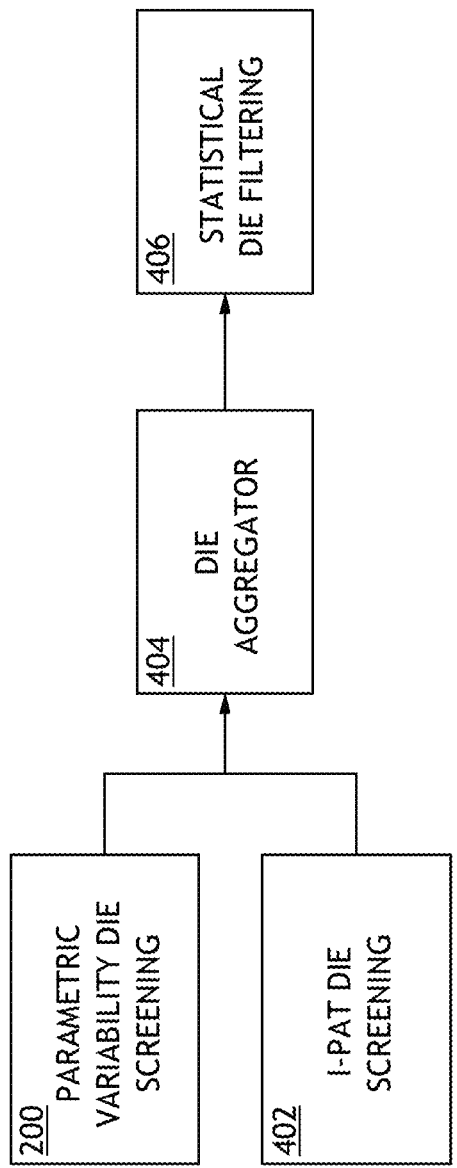
FIG. 4 is a block diagram illustrating aggregate die-level outlier screening using parametric variability screening combined with I-PAT screening, in accordance with one or more embodiments of the present disclosure.

FIG. 4 is a block diagram illustrating aggregate die-level outlier screening using parametric variability screening combined with I-PAT screening (e.g., block 402), in accordance with one or more embodiments of the present disclosure. For example, parametric variability screening data on a population of dies as disclosed herein may be integrated or aggregated with defect data on the population of dies identified using an I-PAT technique (e.g., in block 404), scored, and filtered (e.g., box 406) to provide an output set of outlier dies based on the aggregated approach.

Figure 5:
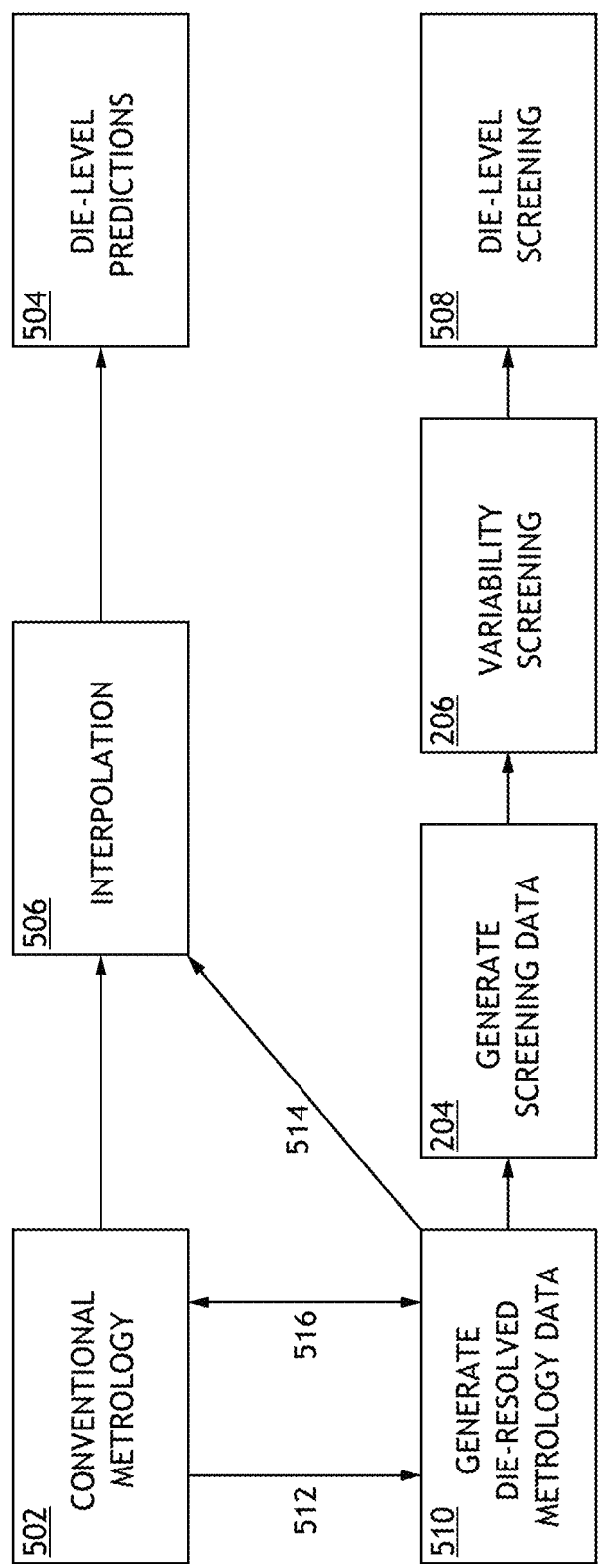
FIG. 5 is a block diagram illustrating multiple interacting paths between conventional metrology and parametric variability screening, in accordance with one or more embodiments of the present disclosure.

In another embodiment, parametric variability screening as disclosed herein is used in combination with conventional metrology. FIG. 5 is a block diagram illustrating multiple interacting paths between conventional metrology and parametric variability screening in accordance with one or more embodiments of the present disclosure.

For example, conventional metrology techniques (box 502) such as those sampling-based techniques requiring measurements on specific locations of a sample, may generate die-level predictions (box 504) based on interpolation of data (box 506) generated on sampled locations. In contrast, as disclosed herein, parametric variability screening (e.g., associated with the method 200) may provide die-level screening (box 508) by generating die-resolved metrology data (box 510) for a population of dies (e.g., step 202), generating screening data based on a subset of the die-resolved metrology data (e.g., step 204), and screening the population of dies (step 206) based on variability in the screening data. Further, the method 200 may be implemented using different techniques and aggregated or otherwise combined as described previously herein such that the die-level screening (box 508) may correspond to aggregated die-level screening.

Additionally, as illustrated in FIG. 5, conventional metrology techniques (box 502) may interact with parametric variability screening (method 200) in various ways. In one embodiment, conventional metrology (box 502) is used to calibrate (arrow 512) the parametric variability screening (method 200). For example, conventional metrology (box 502) may be used to calibrate measurements of process parameters generated in method 200. In another embodiment, parametric variability screening (method 200) may be used to facilitate, assist, or calibrate (arrow 514) the interpolation of conventional metrology measurements (box 506) based on the increased resolution provided in the die-resolved metrology data. In another embodiment, the two techniques may be utilized in parallel as a hybrid technique (arrow 516).

In another embodiment, parametric variability screening as disclosed herein is used to provide feed-forward or feed-sideways adjustments of a fabrication process in a control system. For example, die-resolved metrology data associated with various targets or regions of a sample (e.g., metrology pads, uniform memory arrays, or the like) may be utilized to assist or improve other conventional metrology measurements. As a non-limiting illustration, the die-resolved metrology data associated with a blank film pad on a sample may be used to generate thickness or composition information for that layer, which may then be used in a uniform CD array to provide better CD measurements, which may in turn be used in an overlay-sensitive area to reduce ambiguity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A die screening system comprising:
   a controller communicatively coupled to one or more in-line metrology tools, wherein the controller includes one or more processors configured to execute program instructions causing the one or more processors to:
   receive die-resolved metrology data for a plurality of dies on one or more samples from the one or more in-line metrology tools after one or more fabrication steps, wherein the die-resolved metrology data includes one or more images generated using one or more measurement configurations of the one or more in-line metrology tools, wherein the die-resolved metrology data provides a plurality of measurement channels per die of the plurality of dies, wherein each measurement channel corresponds to a particular pixel of a particular image generated by a particular in-line metrology tool after a particular processing step;
   generate screening data for the plurality of dies from the die-resolved metrology data, wherein the screening data includes a subset of the plurality of measurement channels of the die-resolved metrology data, wherein the die-resolved metrology data comprises at least one of critical dimension measurement data, overlay measurement data, sidewall angle measurement data, feature height measurement data, film composition measurement data, focal position data, or dose data, wherein the subset of the plurality of measurement channels in the screening data are sensitive to process variations associated with fabrication of the one or more samples;
   screen the plurality of dies into two or more disposition classes based on variability in the screening data, from the die-resolved metrology data, between multiple dies, wherein the two or more disposition classes include at least a set of pass dies and a set of outlier dies; and
   provide one or more adjustments to one or more fabrication tools for processing one or more layers of one or more additional dies based on the variability of the plurality of dies.

2. The die screening system of claim 1, further comprising:
   screening the set of outlier dies for at least one of additional testing or removal from a supply chain.

3. The die screening system of claim 1, wherein at least one of the one or more in-line metrology tools comprises:
   an imaging reflectometer.

4. The die screening system of claim 3, wherein the imaging reflectometer comprises:
   a multi-channel imaging reflectometer including two or more measurement channels providing different measurement parameters, wherein the die-resolved metrology data includes two or more reflectometry images associated with at least two of the two or more measurement channels.

5. The die screening system of claim 4, wherein at least one of the two or more measurement channels comprises a bright-field image.

6. The die screening system of claim 4, wherein at least one of the two or more measurement channels comprises a dark-field image.

7. The die screening system of claim 4, wherein the one or more measurement configurations comprise:
   at least one of an illumination wavelength, an illumination polarization, an illumination incidence angle, a collection polarization, or a collection angle.

8. The die screening system of claim 1, wherein the one or more in-line metrology tools include at least one of a hyperspectral imaging tool or an X-ray ptychography tool.

9. The die screening system of claim 1, wherein generate the screening data for the plurality of dies from the die-resolved metrology data comprises:
   select the subset of the plurality of measurement channels of the die-resolved metrology data providing at least one of a known or an expected variability to process variations associated with the fabrication of the one or more samples.

10. The die screening system of claim 1, wherein generate the screening data for the plurality of dies from the die-resolved metrology data comprises:
    select the subset of the plurality of measurement channels of the die-resolved metrology data associated with specific locations or regions of interest.

11. The die screening system of claim 1, wherein generate the screening data for the plurality of dies from the die-resolved metrology data comprises:
    perform a process design of experiments (DOE) with dies having known process variations; and
    select the subset of the plurality of measurement channels based on the DOE.

12. The die screening system of claim 1, wherein generate the screening data for the plurality of dies from the die-resolved metrology data comprises:
    downsample the die-resolved metrology data to provide a selected number of measurement channels per die of the plurality of dies.

13. The die screening system of claim 9, wherein downsample the die-resolved metrology data to provide a selected number of measurement channels per die of the plurality of dies comprises:
   downsample the die-resolved metrology data to include one or more measurement channels associated with a single measurement location per die of the plurality of dies.

14. The die screening system of claim 1, wherein screen the plurality of dies into two or more disposition classes based on variability in the screening data comprises:
   screen the plurality of dies into two or more disposition classes based on empirical trends in the screening data.

15. The die screening system of claim 1, wherein screen the plurality of dies into two or more disposition classes based on the variability in the screening data comprises:
   determine measurements of one or more process parameters based on the screening data; and
   screen the dies based on the measurements of the one or more process parameters.

16. The die screening system of claim 15, wherein determine the measurements of the one or more process parameters based on the screening data comprises:
   determine the measurements of the one or more process parameters based on the screening data based on a model relating the one or more process parameters to the screening data.

17. The die screening system of claim 16, wherein the model comprises:
   at least one of a rigorous coupled-wave analysis (RCWA) or a finite element method (FEM) model.

18. The die screening system of claim 15, wherein determine the measurements of one or more process parameters based on the screening data comprises:
   determine the measurements of one or more process parameters based on the screening data based on a machine learning model.

19. The die screening system of claim 18, wherein machine learning model comprises:
   at least one of a neural network model, a deep learning model, or a signal response metrology model.

20. The die screening system of claim 15, wherein determine the measurements of one or more process parameters based on the screening data based on a machine learning model comprises:
   fabricate one or more training samples with known values of the one or more process parameters as a design of experiments (DOE);
   generate training die-resolved metrology data for the one or more training samples with the imaging reflectometer;
   train the machine learning model with the known values of the one or more process parameters and the training die-resolved metrology data; and
   generate the measurements of the one or more process parameters with the trained machine learning model using the screening data.

21. The die screening system of claim 15, wherein the one or more processors are further configured to execute program instructions causing the one or more processors to:
   determine root causes associated with variations in the screening data for the set of outlier dies based on the measurements of the one or more process parameters.

22. The die screening system of claim 1, wherein generate the screening data for the plurality of dies from the die-resolved metrology data comprises:
   perform a dimensionality reduction on the plurality of measurement channels to select, as the screening data, a subset of the plurality of measurement channels exhibiting variability to process variations associated with fabrication of the one or more samples.

23. The die screening system of claim 1, wherein screen the plurality of dies into two or more disposition classes based on variability in the screening data comprises:
   screen the plurality of dies into two or more disposition classes based on variability in the screening data using a machine learning model.

24. The die screening system of claim 23, wherein the machine learning model comprises:
   an unsupervised machine learning model.

25. The die screening system of claim 1, wherein the one or more processors are further configured to execute program instructions causing the one or more processors to:
   aggregate the set outlier dies with one or more additional sets of outlier dies associated with the plurality of dies generated using one or more additional screening techniques as an aggregated set of outlier dies; and
   screen the set of outlier dies for at least one of additional testing or removal from a supply chain.

26. The die screening system of claim 25, wherein the one or more additional screening techniques include at least one of an electrical screening technique or an in-line parts average testing (I-PAT) screening technique.

27. The die screening system of claim 1, wherein the one or more processors are further configured to execute program instructions causing the one or more processors to:
   perform one or more additional metrology measurements on at least some of the set of outlier dies;
   determine a root cause of a defectivity of the at least some of the set of outlier dies based on the one or more additional metrology measurements.

28. The die screening system of claim 1, wherein the provide one or more adjustments to one or more fabrication tools for processing one or more layers of one or more additional dies based on the variability of the plurality of dies comprises:
   adjust one or more fabrication tools for processing one or more layers of one or more additional dies based on the variability of the plurality of dies using at least one of a feedback, feed-forward, or a feed-sideways control process.

29. A die screening system comprising:
   one or more in-line metrology tools; and
   a controller communicatively coupled to the one or more in-line metrology tools, the controller including one or more processors configured to execute program instructions causing the one or more processors to:
   receive die-resolved metrology data for a plurality of dies on one or more samples from the one or more in-line metrology tools after one or more fabrication steps, wherein the die-resolved metrology data includes one or more images generated using one or more measurement configurations of the one or more in-line metrology tools, wherein the die-resolved metrology data provides a plurality of measurement channels per die of the plurality of dies, wherein each measurement channel corresponds to a particular pixel of a particular image generated by a particular in-line metrology tool after a particular processing step;
   generate screening data for the plurality of dies from the die-resolved metrology data, wherein the screening data includes a subset of the plurality of measurement channels of the die-resolved metrology data, wherein the die-resolved metrology data comprises at least one of critical dimension measurement data, overlay measurement data, sidewall angle measurement data, feature height measurement data, film composition measurement data, focal position data, or dose data, wherein the subset of the plurality of measurement channels in the screening data are sensitive to process variations associated with fabrication of the one or more samples;

screen the plurality of dies into two or more disposition classes based on variability in the screening data, from the die-resolved metrology data, wherein the two or more disposition classes include at least a set of pass dies and a set of outlier dies; and provide one or more adjustments to one or more fabrication tools for processing one or more layers of one or more additional dies based on the variability of the plurality of dies.

30. The die screening system of claim 29, wherein the one or more in-line metrology tools include at least one of an imaging reflectometer, a hyperspectral imaging tool or an X-ray ptychography tool.

31. A die screening method comprising:

generating die-resolved metrology data for a plurality of dies on one or more samples from one or more in-line metrology tools after one or more fabrication steps, wherein the die-resolved metrology data includes one or more images generated using one or more measurement configurations of the one or more in-line metrology tools, wherein the die-resolved metrology data provides a plurality of measurement channels per die of the plurality of dies, wherein each measurement channel corresponds to a particular pixel of a particular image generated by a particular in-line metrology tool after a particular processing step;

generating screening data for the plurality of dies from the die-resolved metrology data, wherein the screening data includes a subset of the plurality of measurement channels of the die-resolved metrology data, wherein the die-resolved metrology data comprises at least one of critical dimension measurement data, overlay measurement data, sidewall angle measurement data, feature height measurement data, film composition measurement data, focal position data, or dose data, wherein the subset of the plurality of measurement channels in the screening data are sensitive to process variations associated with fabrication of the one or more samples;

screening the plurality of dies into two or more disposition classes based on variability in the screening data, from the die-resolved metrology data, wherein the two or more disposition classes include at least a set of pass dies and a set of outlier dies; and providing one or more adjusts to one or more fabrication tools for processing one or more layers of one or more additional dies based on the variability of the plurality of dies.

32. The die screening method of claim 31, further comprising:

screening the set of outlier dies for at least one of additional testing or removal from a supply chain.

33. The die screening method of claim 31, wherein generating the screening data for the plurality of dies from the die-resolved metrology data comprises:

selecting the subset of the plurality of measurement channels of the die-resolved metrology data providing at least one of a known or an expected variability to process variations associated with the fabrication of the one or more samples.

34. The die screening method of claim 31, wherein generating the screening data for the plurality of dies from the die-resolved metrology data comprises:

selecting the subset of the plurality of measurement channels of the die-resolved metrology data associated with specific locations or regions of interest.

35. The die screening method of claim 31, wherein generating the screening data for the plurality of dies from the die-resolved metrology data comprises:

performing a process design of experiments (DOE) with dies having known process variations; and selecting the subset of the plurality of measurement channels based on the DOE.

36. The die screening method of claim 31, wherein generating the screening data for the plurality of dies from the die-resolved metrology data comprises:

downsampling the die-resolved metrology data to provide a selected number of measurement channels per die of the plurality of dies.

37. The die screening method of claim 31, wherein screening the plurality of dies into two or more disposition classes based on the variability in the screening data comprises:

determining measurements of one or more process parameters based on the screening data; and screening the dies based on the measurements of the one or more process parameters.

38. The die screening method of claim 37, wherein determining measurements of one or more process parameters based on the screening data comprises:

determining measurements of one or more process parameters based on the screening data based on a model relating the one or more process parameters to the screening data.

39. The die screening method of claim 37, wherein determining measurements of one or more process parameters based on the screening data comprises:

determining measurements of one or more process parameters based on the screening data based on a machine learning model.

40. The die screening method of claim 39, wherein determining measurements of one or more process parameters based on the screening data based on the machine learning model comprises:

fabricating one or more training samples with known values of the one or more process parameters as a design of experiments (DOE);

generating training die-resolved metrology data for the one or more training samples with the imaging reflectometer;

training the machine learning model with the known values of the one or more process parameters and the training die-resolved metrology data; and generating the measurements of the one or more process parameters with the trained machine learning model using the screening data.

41. The die screening method of claim 37, wherein the one or more processors are further configured to execute program instructions causing the one or more processors to:

determine root causes associated with variations in the screening data for the set of outlier dies based on the measurements of the one or more process parameters.

42. The die screening method of claim 31, wherein generating the screening data for the plurality of dies from the die-resolved metrology data comprises:
- performing a dimensionality reduction on the plurality of measurement channels to select, as the screening data, a subset of the plurality of measurement channels exhibiting variability to process variations associated with fabrication of the one or more samples.

43. The die screening method of claim 31, wherein screening the plurality of dies into two or more disposition classes based on variability in the screening data comprises:
- screening the plurality of dies into two or more disposition classes based on variability in the screening data using a machine learning model.

44. The die screening method of claim 31, further comprising:
- aggregating the set of outlier dies with one or more additional sets of outlier dies associated with the plurality of dies generated using one or more additional screening techniques as an aggregated set of outlier dies; and
- screening the set of outlier dies for at least one of additional testing or removal from a supply chain.

* * * * *